(12) United States Patent
Browning et al.

(10) Patent No.: US 9,493,876 B2
(45) Date of Patent: Nov. 15, 2016

(54) CHANGING COLORS OF MATERIALS

(71) Applicant: Apple Inc., Cupertio, CA (US)

(72) Inventors: Lucy E. Browning, San Francisco, CA (US); Christopher D. Prest, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 25 days.

(21) Appl. No.: 14/023,410

(22) Filed: Sep. 10, 2013

(65) Prior Publication Data

US 2014/0076600 A1 Mar. 20, 2014

Related U.S. Application Data (60) Provisional application No. 61/846,563, filed on Jul. 15, 2013, provisional application No. 61/702,202, filed on Sep. 17, 2012, provisional application No. 61/701,568, filed on Sep. 14, 2012.

(51) Int. Cl.
| | |
|---|---|
| *B22F 7/02* | (2006.01) |
| *C23C 28/04* | (2006.01) |
| *H05K 5/02* | (2006.01) |
| *C25D 11/02* | (2006.01) |
| *C25D 11/18* | (2006.01) |
| *B82Y 99/00* | (2011.01) |

(52) U.S. Cl.
CPC ............... *C23C 28/04* (2013.01); *C25D 11/02* (2013.01); *C25D 11/18* (2013.01); *H05K 5/0243* (2013.01); *B82Y 99/00* (2013.01)

(58) Field of Classification Search
None
See application file for complete search history.

(56) References Cited

U.S. PATENT DOCUMENTS

| | | | |
|---|---|---|---|
| 3,747,117 A | | 7/1973 | Fechter |
| 3,765,994 A | | 10/1973 | Quaintance et al. |
| 4,210,499 A | * | 7/1980 | Hirono ..................... B05D 1/20 148/244 |
| 4,519,876 A | | 5/1985 | Lee et al. |
| 4,753,863 A | * | 6/1988 | Spanjer ......................... 430/138 |
| 4,972,061 A | | 11/1990 | Duley et al. |
| 5,472,788 A | | 12/1995 | Benitez |
| 5,510,015 A | * | 4/1996 | Martinez et al. ............. 205/173 |
| 6,083,871 A | | 7/2000 | Fromson et al. |

(Continued)

FOREIGN PATENT DOCUMENTS

| | | |
|---|---|---|
| CN | 85103365 A | 12/1986 |
| CN | 1336878 A | 2/2002 |

(Continued)

OTHER PUBLICATIONS

Hashimoto et al., "Ag Nanoparticle Films for Color Applications", Sep. 2011, Mater. Res. Symp. Proc., vol. 1343, pp. 1-6.*

(Continued)

*Primary Examiner* — Humera Sheikh
*Assistant Examiner* — Seth Dumbris
(74) *Attorney, Agent, or Firm* — Joseph F. Guihan (57) ABSTRACT

The described embodiments relate generally to cosmetic surfaces and associated treatments to alter a color of cosmetic surfaces. According to one embodiment, cosmetic ink configured to be applied to a cosmetic surface can include a suspension matrix configured to suspend a number of small particles in the suspension matrix. Each of the small particles of the is within a desired overall diameter to cause a user to perceive a desired color due to plasmon resonance of the small particles.

6 Claims, 10 Drawing Sheets

(56) References Cited

U.S. PATENT DOCUMENTS

| | | | |
|---|---|---|---|
| 6,127,050 A | 10/2000 | Fromson et al. | |
| 6,139,713 A | 10/2000 | Masuda et al. | |
| 6,180,415 B1* | 1/2001 | Schultz | B82Y 30/00 |
| | | | 356/301 |
| 6,238,847 B1* | 5/2001 | Axtell et al. | 430/322 |
| 6,548,264 B1* | 4/2003 | Tan et al. | 435/7.21 |
| 6,613,161 B2 | 9/2003 | Zheng et al. | |
| 6,777,098 B2 | 8/2004 | Yeo | |
| 6,821,305 B2 | 11/2004 | Yan | |
| 6,866,710 B2* | 3/2005 | Heider et al. | 106/403 |
| 6,884,336 B2* | 4/2005 | Kia et al. | 205/324 |
| 7,144,627 B2* | 12/2006 | Halas | A61K 41/0042 |
| | | | 428/403 |
| 7,173,276 B2 | 2/2007 | Choi et al. | |
| 7,187,396 B2* | 3/2007 | Carroll et al. | 347/224 |
| 8,029,554 B2 | 10/2011 | Holman et al. | |
| 8,993,921 B2 | 3/2015 | Browning et al. | |
| 9,181,629 B2 | 11/2015 | Browning et al. | |
| 2002/0132105 A1 | 9/2002 | Robertson et al. | |
| 2002/0171732 A1 | 11/2002 | Carroll | |
| 2003/0001150 A1 | 1/2003 | Iwasaki et al. | |
| 2004/0194235 A1 | 10/2004 | Yan | |
| 2005/0175836 A1* | 8/2005 | Kuehnle et al. | 428/403 |
| 2005/0211566 A1 | 9/2005 | Tomita et al. | |
| 2006/0197953 A1 | 9/2006 | Perez et al. | |
| 2006/0254922 A1* | 11/2006 | Brevnov et al. | 205/205 |
| 2007/0141342 A1* | 6/2007 | Kuehnle | C09C 1/00 |
| | | | 428/403 |
| 2007/0190298 A1* | 8/2007 | Hampden-Smith et al. | 428/204 |
| 2007/0281140 A1* | 12/2007 | Haubrich et al. | 428/206 |
| 2007/0284261 A1* | 12/2007 | Shimotani | C25C 1/20 |
| | | | 205/571 |
| 2008/0026207 A1* | 1/2008 | Fink-Petri et al. | 428/328 |
| 2008/0057293 A1 | 3/2008 | Hatanaka et al. | |
| 2008/0073220 A1* | 3/2008 | Doyle | C23C 22/83 |
| | | | 205/324 |
| 2008/0274375 A1* | 11/2008 | Ng et al. | 428/687 |
| 2009/0022995 A1* | 1/2009 | Graham | B82Y 30/00 |
| | | | 428/409 |
| 2009/0120358 A1 | 5/2009 | Harada et al. | |
| 2009/0181262 A1* | 7/2009 | Isaksson | B44C 1/00 |
| | | | 428/626 |
| 2009/0323171 A1* | 12/2009 | Gibson | 359/296 |
| 2010/0015558 A1 | 1/2010 | Jarvis et al. | |
| 2010/0183869 A1* | 7/2010 | Lin et al. | 428/332 |
| 2010/0215926 A1* | 8/2010 | Askin et al. | 428/209 |
| 2010/0224026 A1* | 9/2010 | Brennan Fournet | B22F 9/24 |
| | | | 75/370 |
| 2011/0193928 A1 | 8/2011 | Zhang | |
| 2011/0284381 A1 | 11/2011 | Cabot et al. | |
| 2012/0021120 A1* | 1/2012 | Feldstein | 427/8 |
| 2013/0224406 A1* | 8/2013 | Chang et al. | 428/34.1 |
| 2015/0132541 A1 | 5/2015 | McDonald et al. | |
| 2015/0176146 A1 | 6/2015 | Browning et al. | |
| 2016/0024680 A1 | 1/2016 | Browning et al. | |

FOREIGN PATENT DOCUMENTS

| | | | |
|---|---|---|---|
| EP | 993964 A2 | 4/2000 | |
| EP | 1110660 * | 11/2000 | B23K 26/00 |
| JP | S60197897 A | 10/1985 | |
| JP | S62020898 A | 1/1987 | |
| JP | 01205094 A | 8/1989 | |
| JP | H06317921 A | 11/1994 | |
| JP | H10121292 A | 5/1998 | |
| JP | 2009221140 * | 10/2009 | A61K 8/19 |
| JP | 2013084954 A | 5/2013 | |
| KR | 1020080031966 A | 4/2008 | |
| TW | 200524460 A | 7/2005 | |
| TW | 200714747 A | 4/2007 | |
| WO | WO2012076467 A2 | 6/2012 | |
| WO | WO2014130451 A1 | 8/2014 | |
| WO | WO2014130452 A1 | 8/2014 | |
| WO | WO2014130453 A1 | 8/2014 | |

OTHER PUBLICATIONS

PCT/US2013/059793. Intl Search Report-Written Opinion (Dec. 23, 2013).

Wang, et al. "Tuning color by pore depth of metal-coated porous alumina." Nanotechnology, vol. 22, No. 30, pp. 1-6 (2011).

Huang, et al. "Optical characteristics of pore size on porous anodic aluminum oxide films with embedded silver nanoparticles." Sensors & Actuators A: Physical, vol. 180, pp. 49-54. (Apr. 7, 2012).

Hu, et al. "Photosensitive gold-nanoparticle-embedded dielectric nanowires." Nature Materials vol. 5, No. 2, pp. 102-106 (2006).

Li, et al., "Brilliant and tunable color by changing pore diameter of metal-coated porous anodic alumina." SPIE Proceedings, vol. 8564, pp. 8564Q-1-8564Q-6 (Nov. 20, 2012).

Furneaux et al., "The formation of controlled-porosity membranes from anodically oxidized Aluminium", Nature, vol. 337, Jan. 1989, pp. 147-149.

Masuda, "Highly ordered metal nanohole arrays based on anodized alumina", Solid State Physics, vol. 31, No. 5, Dec. 1996, pp. 493-499.

PCT/US2013/047163. International Search Report and Written Opinion (Sep. 25, 2013).

Taiwanese Patent Application No. 104120036—Office Action dated Feb. 15, 2016.

Korean Patent Application No. 10-2015-7001318—Notice of Preliminary Rejection dated Feb. 28, 2016.

Japanese Patent Application No. 2015-518627—First Office Action dated Feb. 29, 2016.

Chinese Application for Invention No. 201380032781.6—First Office Action dated Apr. 27, 2016.

PCT/US14/051527. Int'l Search Report & Written Opinion (Nov. 24, 2014).

Sunada, et al. "Dielectric properties of Al—Si composite oxide films formed on electropolished and DC-etched aluminum by electrophoretic sol-gel coating and anodizing." J. Solid State Electrochem. vol. 11, No. 10:1375-1384 (Oct. 2007).

Chen et al, "The effect of anodizing voltage on the electrical properties of Al-Ti composite oxide film on aluminum." J. Electroanalytic Chem. vol. 590, No. 1:26-31 (May 2006).

\* cited by examiner

100
CHANGING COLORS OF MATERIALS

CROSS-REFERENCE TO RELATED APPLICATIONS

This application claims priority under 35 U.S.C. 119(e) to U.S. Provisional Patent Application No. 61/846,563, filed Jul. 15, 2013, and entitled "CHANGING COLORS OF MATERIALS" by Browning and to U.S. Provisional Patent Application No. 61/702,202, filed Sep. 17, 2012, and entitled "ANODIZATION" by Lynch, and to U.S. Provisional Patent Application No. 61/701,568, filed Sep. 14, 2012, and entitled "ANODIZATION" by Lynch, all of which are incorporated herein by reference in their entirety for all purposes.

FIELD OF THE DESCRIBED EMBODIMENTS

The described embodiments relate generally to cosmetic surfaces and more particularly to changing the color of a cosmetic surface using nano-particles.

BACKGROUND

As technology advances, product designs in general, and designs for mobile products in particular, concentrate on aesthetics and durability. Durable metal housings for products typically receive surface treatments to alter physical appearance and characteristics which increase the aesthetic quality perceived by a user. For example, anodized aluminum in particular is a conventional manner in which to provide a cosmetic surface with reasonable durability having unique aesthetic characteristics. Different colors may be applied through dyes for cosmetic appeal and sealing techniques may further be applied for durability. Glass cover substrates, plastic substrates, and other substrates may also be used. Typically, paint and/or hard sealants may be applied to enhance their durability and appearance. However, graphical appliques and other enhancements beneath sealing layers may cause disturbances in the otherwise smooth sealant surface. For example, traditional inks and pigments require significant thickness to achieve opacity (e.g., about 40 µm in white pigments). Application of a sealing layer about these traditional inks would cause a step to form, thereby detracting from cosmetic appeal. Furthermore, even if using traditional inks and pigments to color a large area absent visible transitions, the increased thickness may cause further problems due to changes in overall substrate thickness.

Therefore, what is desired are methods to alter color and perceived color of surfaces and/or portions thereof without the drawbacks of traditionally bulky pigment layers.

SUMMARY OF THE DESCRIBED EMBODIMENTS

This paper describes various embodiments that relate to altering the color of a cosmetic surface. In one embodiment, a cosmetic ink is described which is configured to be applied to a cosmetic surface. The cosmetic ink can include a suspension matrix and a plurality of nano-particles suspended therein. The nano-particles themselves may be covered in a sizing to reduce interaction therebetween. Each nano-particle may be chosen to be within a desired overall diameter to cause a user to perceive a desired color due to plasmon resonance of the nano-particles.

According to another embodiment, a method of applying a surface treatment to a substrate is described. The method can include obtaining the substrate, wherein the substrate has a first surface associated therewith, anodizing at least a portion of the first surface to create an anodized layer, depositing a particle based pigment onto the anodized layer to create a pigmented anodized layer, and sealing the pigmented anodized layer.

According to yet another embodiment, a method of applying a surface treatment to a substrate is described. The method can include obtaining the substrate, wherein the substrate has a first surface associated therewith, and depositing a cosmetic ink onto at least a portion of the first surface. The cosmetic ink includes a suspension matrix configured to suspend a number of particles suspended in the suspension matrix. Each of the particles is within a desired overall diameter to cause a user to perceive a desired color due to plasmon resonance of the nano-particles.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. These drawings are not necessarily drawn to scale. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The trend in some modern electronic devices is to increase aesthetics and durability. Durable metal housings for products typically receive surface treatments to alter physical appearance and characteristics which increase the aesthetic quality perceived by a user. For example, anodized aluminum in particular is a conventional manner in which to provide a cosmetic surface with reasonable durability having unique aesthetic characteristics. Different colors may be applied through dyes for cosmetic appeal and sealing techniques may further be applied for durability. Glass cover substrates, plastic substrates, and other substrates may also be used. Typically, paint and/or hard sealants may be applied to enhance their durability and appearance. However, graphical appliques and other enhancements beneath sealing layers may cause disturbances in the otherwise smooth sealant surface. For example, traditional inks and pigments require significant thickness to achieve opacity (e.g., about 40 μm in white pigments). Application of a sealing layer about these traditional inks would cause a step to form, thereby detracting from cosmetic appeal. The step detracts from an overall cosmetic appeal of the device as it will strongly reflect light at certain angles. Furthermore, even if using traditional inks and pigments to color a large area absent visible transitions, the increased thickness may cause further problems due to changes in overall substrate thickness.

According to exemplary embodiments, cosmetic surface treatments allow for specific color engineering and decreased thickness through implementation of a small particle based dye or pigment. The small particles within the dye or pigment can be on the order of between about 5-150 nanometers (nm) in diameter and can be referred to as nano-particles. It should be understood that use of the word nano-particles should not be construed as limiting and refers to a range of particle sizes applicable to the disclosed embodiments. The dye or pigment may be applied to any suitable surface of a substrate, including aluminum, plastic, glass, or the like. The dye or pigment may be used to selectively alter the color of the surface, for example, if used as an ink. Additionally, the dye or pigment may be used to alter the color of a larger portion of the surface. Still further, the dye or pigment may be used to alter the color of a large portion or the entire surface, while smaller portions are subsequently processed to effect a color shift through novel agglomeration-inducing techniques. Hereinafter the aspects and benefits of exemplary surface treatments are described in detail with reference to the many drawings.

Figure 1:
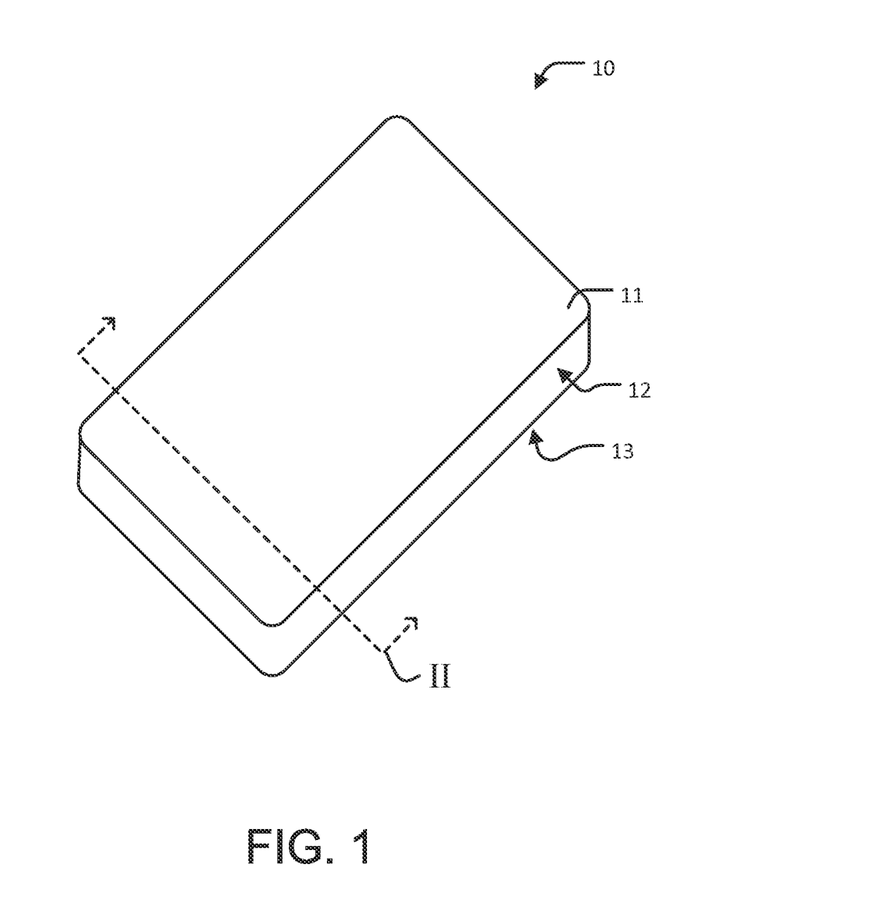
FIG. 1 shows a perspective view of a housing of a personal electronic device.

FIG. 1 shows a perspective view of a housing 10 of a personal electronic device. The housing 10 can be formed of any suitable material, including metals such as aluminum, steel, stainless steel, copper, and/or alloys. The housing 10 may have a first surface 11, one or more second or side surfaces 12, and a rear surface 13. The orientation, shape, volume, and arrangement of the surfaces 11, 12, and 13 can be varied in any suitable manner without departing from this disclosure. Generally, one or more of the surfaces 11, 12, 13 may have a surface treatment applied thereto, such as, for example, an anodized finish surface treatment.

Figure 2:
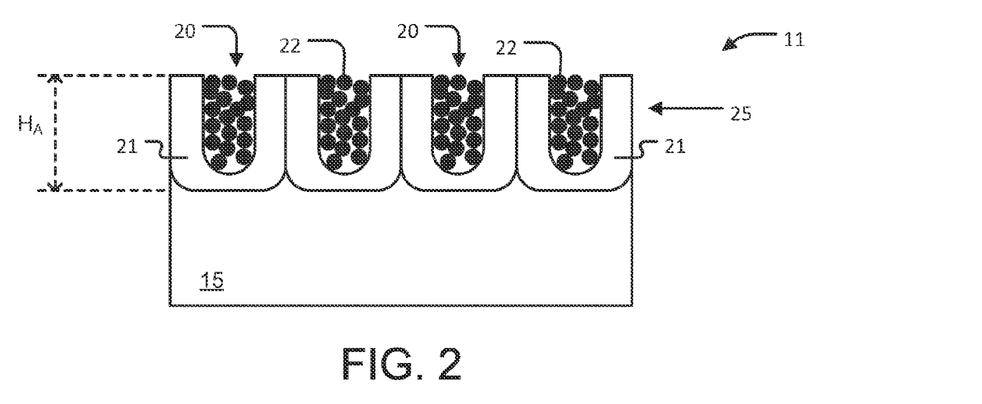
FIG. 2 shows a cross-sectional view of a portion of the housing of FIG. 1 having a surface treatment applied thereto, in accordance with an exemplary embodiment.

FIG. 2 shows a cross-sectional view of a portion of the housing 10 having an exemplary surface treatment applied thereto. As illustrated, the surface 11 comprising base substrate material 15 has been anodized to form an anodized layer 25. The anodized layer 25 may have a total thickness or height $H_A$. The anodized layer 25 comprises a plurality of transparent or substantially transparent anodic oxide pores 21. These pores 21 have a pore cavity 20 formed therein, which may accept dye, sealant, or other material. In one embodiment pore cavity 20 can have an opening with a diameter of about 100 nanometers. In such an embodiment the nano-particles can be limited to a diameter of between about 5 and 100 nanometers so that they fit within the anodic pore cavities. In this example, pigment particles 22 have been deposited or applied to the anodized layer 25 such that pore cavities 20 receive and support pigment nano-particles 22. With regards to this specification, these pigment nano-particles can be defined as having a diameter of between about 5 and 150 nanometers.

In one embodiment, pigment nano-particles 22 themselves can be covered by a sizing layer to reduce interaction between adjacent nano-particles. The sizing may comprise silica or an equivalent or suitable sizing layer. Each nano-particle may be chosen to be within a desired overall diameter and geometry to cause a user to perceive a desired color due to plasmon resonance of the nano-particles. For example, plasmon resonance generally refers to a phenomenon by which light shining on the layer 25 (and therefore the pigment nano-particles 22) gives rise to a plasmon, or group of electrons moving in substantial synchronization, on individual nano-particles. If the frequency of the plasmon's oscillation is the same as the frequency of incident light which caused its generation, a strong absorption is seen in a given spectrum, and reflected light is the light of the particle. Specific perceived color depends upon the size and geometry of the individual nano-particles. It should be noted that the above mentioned plasmon resonance phenomenon is generally associated with inert metal nano-particles such as for example copper, gold and silver. Generally, a plurality of different colors may be engineered through application of differing nano-particles. Hereinafter, several examples of possible colors are provided with associated nano-particle composition. It should be understood that these examples are not exhaustive, may be combined or applied to any technique or embodiment described herein, and are in no way limiting.

In one embodiment, white pigment nano-particles 22 are provided. The white pigment comprises spherical silver (Ag) nano-particles of about 80 nm to 110 nm in diameter. The overall thickness of the white pigment required to achieve a relatively opaque coloring is less than or about 2 μm, but may be thicker in some implementations.

In another embodiment, red pigment nano-particles 22 are provided. The red pigment comprises spherical gold (Au) nano-particles of about 40 nm in diameter. Variations in a diameter of each of the spherical gold nano-particles can affect a shade of the red color produced. For example, spherical gold nano-particles can appear red when they have a diameter between 10 nm and 80 nm. The overall thickness of the red pigment required to achieve a relatively opaque coloring is less than or about 2 μm, but may be thicker in some implementations.

In another embodiment, gold-white (or slightly off-white) pigment nano-particles 22 are provided. The gold-white pigment comprises spherical silver (Ag) nano-particles of about 86 nm to 94 nm in diameter. The overall thickness of the gold-white pigment required to achieve a relatively opaque coloring is less than or about 2 μm, but may be thicker in some implementations.

In another embodiment, an alternate red pigment 22 is provided. The alternate red pigment comprises polygonal silver (Ag) nano-particles tuned for a peak resonance of about 550 nm. The polygonal shapes may vary, but may generally have a triangular, hexagonal, or any other suitable cross-sectional shape. The overall thickness of the alternate red pigment required to achieve a relatively opaque coloring is less than or about 2 μm, but may be thicker in some implementations.

In another embodiment, a blue pigment 22 is provided. The blue pigment comprises polygonal silver (Ag) nano-particles tuned for a peak resonance of about 750 nm. The polygonal shapes may vary, but may generally have a triangular, hexagonal, or any other suitable cross-sectional shape. The overall thickness of the blue pigment required to achieve a relatively opaque coloring is less than or about 2 μm, but may be thicker in some implementations.

In yet another embodiment, a green pigment 22 is provided. The green pigment comprises polygonal silver (Ag) nano-particles tuned for a peak resonance of about 950 nm. The polygonal shapes may vary, but may generally have a triangular, hexagonal, or any other suitable cross-sectional shape. The overall thickness of the green pigment required to achieve a relatively opaque coloring is less than or about 2 μm, but may be thicker in some implementations.

Subsequent to adding a pigment to anodized layer 25, anodized layer 25 can be sealed (not illustrated for clarity) in some embodiments. The sealing layer can be tuned for a relatively clear appearance such that the sealing layer doesn't alter or obscure the pigments added to the anodized layer.

Although described above as relating to pigments suspended in relatively clear anodic pores, it should be understood that the same may be varied in many ways. For example, a clear or relatively clear matrix suspension material may be used to suspend nano-particles in a manner which effectively creates a nano-particle based ink or dye. This ink or dye may be applied in a number of ways including pad printing, screen printing and spraying. These application methods can be used on many different types of surfaces, and can be utilized to further enhance the color changing aspects described above. For example, the ink or dye may be applied to a substrate, including an aluminum, stainless steel, plastic, glass, or other substrate to create graphics or other cosmetic enhancements. Thereafter, it may be sealed. Sealing can be applied by using a polymer based coating (e.g. a urethane hard coat) or using a protective PVD process (e.g. $SiO_2$) or by placing a sheet of durable transparent material (e.g. glass, sapphire, plastic) over a top layer of the anodic layer. However, due to the relatively small thicknesses required to have relatively opaque colorings, interface "steps" between interfaces of raw substrate and the dye may be reduced. Hereinafter, various details regarding nano-particle based dyes and inks are described with reference to FIGS. 3-5.

Figure 3:
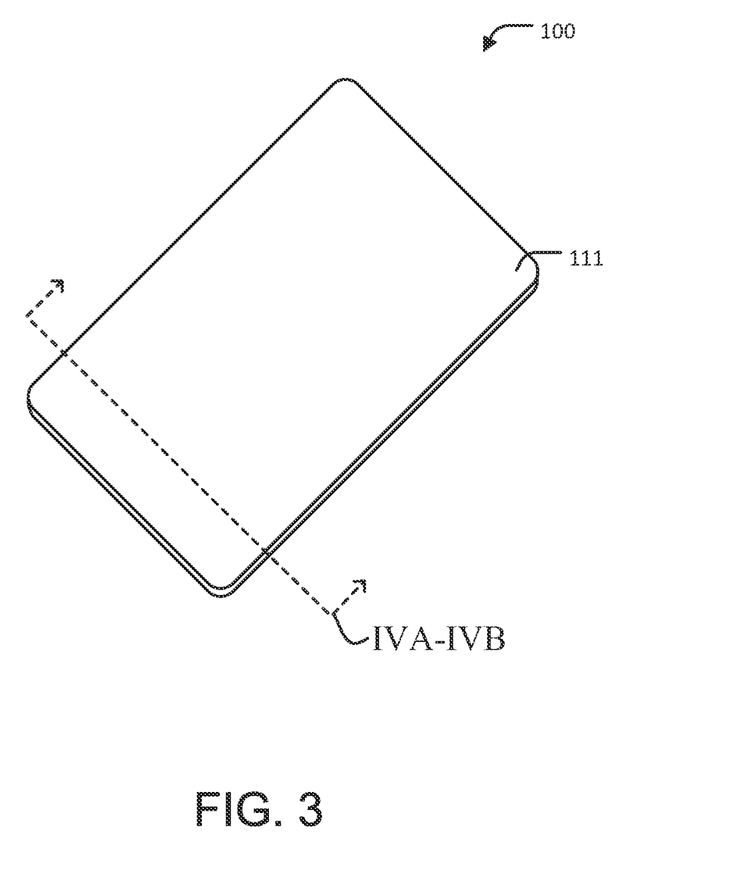
FIG. 3 shows a perspective view of a substrate.

FIG. 3 shows a perspective view of a substrate 100. Generally, substrate 100 can be formed of any suitable material, including, for example, aluminum, stainless steel, plastic, glass, or other suitable material. The substrate 100 may include a cosmetic surface 115 (or non-cosmetic surface in some embodiments) to which an exemplary nano-particle based dye or ink is applied. For example, FIGS. 4A-4B show cross-sectional views of a portion of the substrate of FIG. 3 having a surface treatment or nano-particle based dye or ink applied thereon, in accordance with an exemplary embodiment.

Figure 4A:
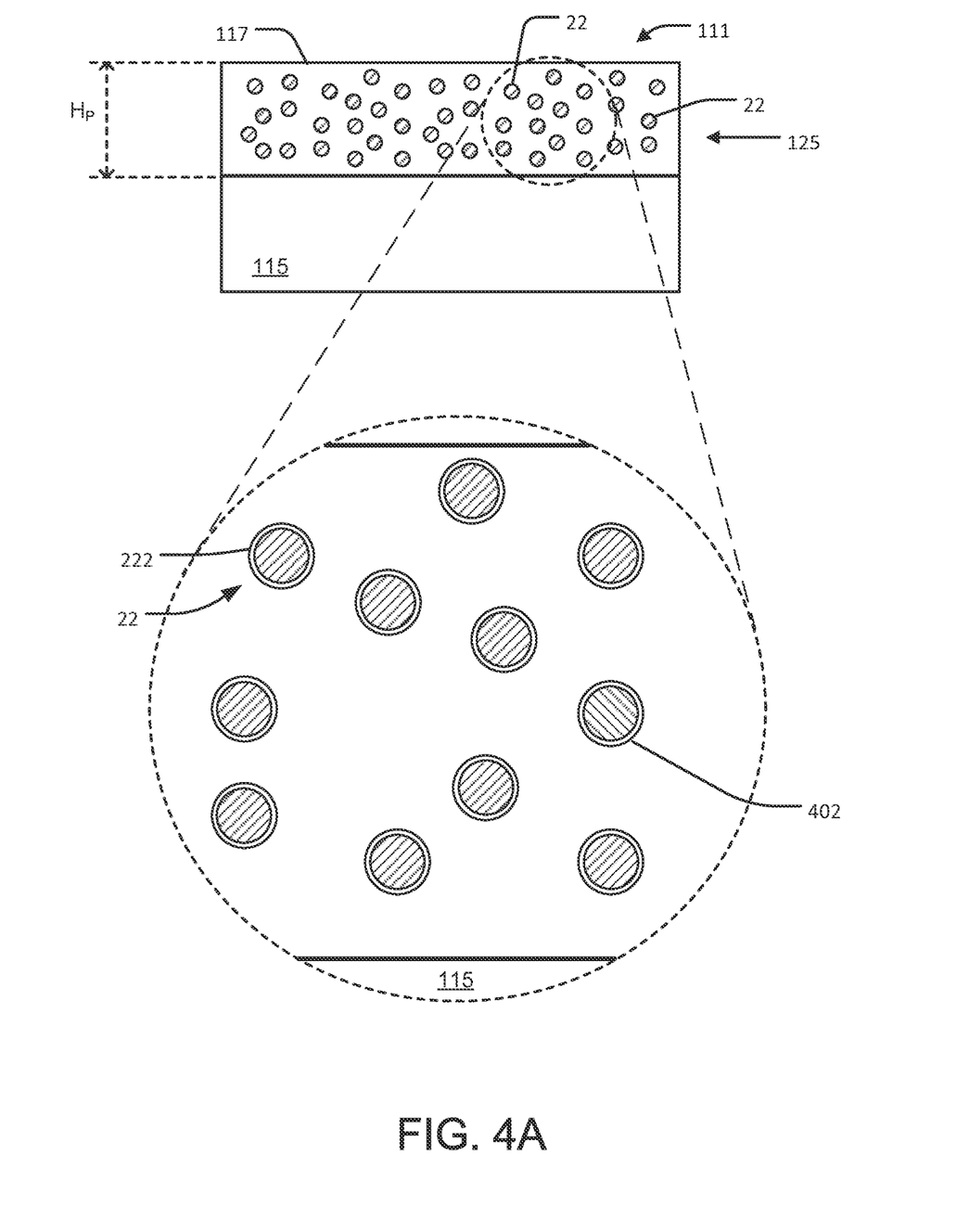
FIGS. 4A-4B show cross-sectional views of a portion of the substrate of FIG. 3 having a surface treatment applied thereon, in accordance with an exemplary embodiment.
Figure 4B:
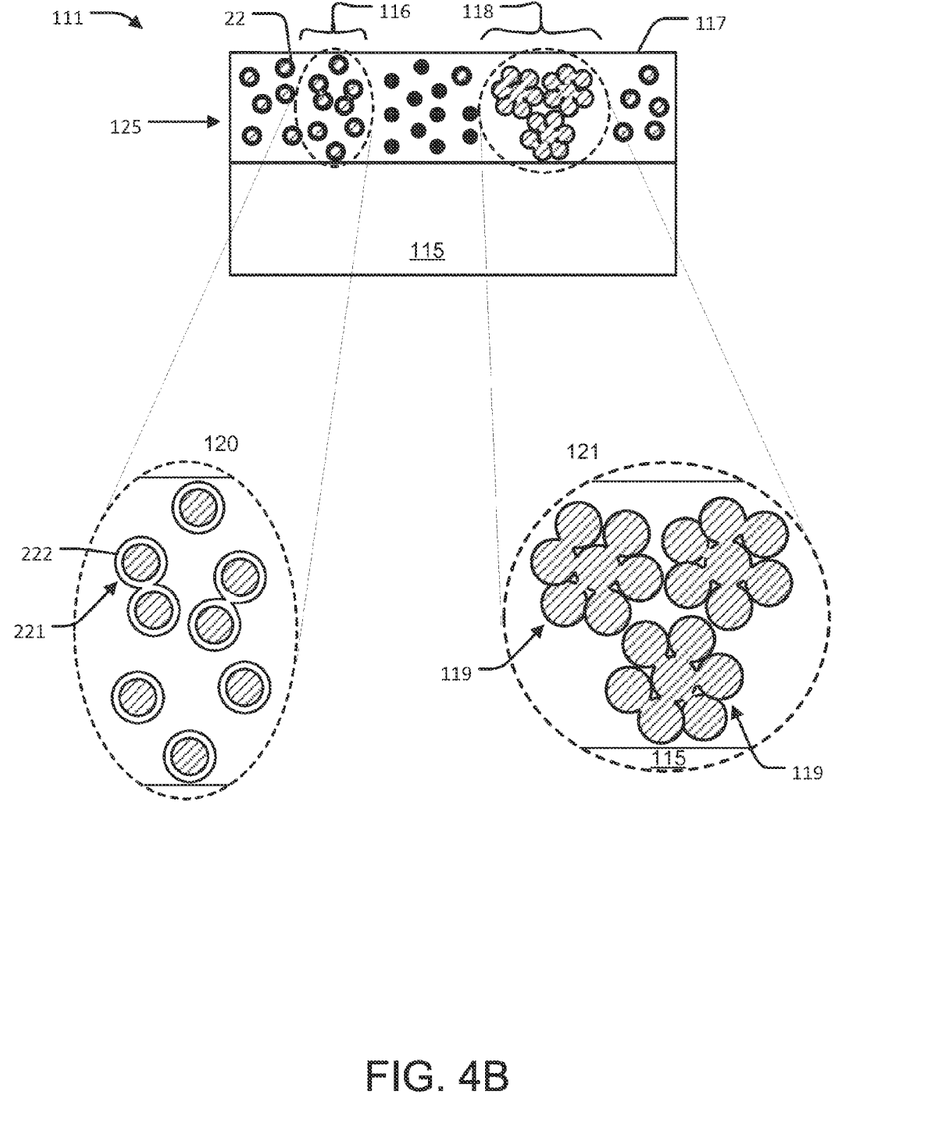

As illustrated in FIG. 4A, surface 111 includes base substrate material 115 has a nano-particle dye layer 125 applied thereon. The dye layer 125 may have a total thickness or height $H_P$. The dye layer 125 comprises a suspension matrix 117 and may be substantially transparent. The suspension matrix 117 may accept dye as described above. In this example, pigment nano-particles 22 have been deposited within or applied to the dye layer 125 such that the suspension matrix 117 supports pigment nano-particle 22. In some embodiments, as depicted in the close up view, pigment nano-particle 402 can be different than nano-particle dye pigment 22. The difference between the nano-particles can be a material difference, a geometric difference, and/or a size difference. By varying the type of nano-particle, color variations can be introduced along surface 111. In this depiction, each of the depicted nano-particles includes a layer of sizing configured to reduce interaction between the nano-particles. The sizing can be a silica-based sizing layer, which can prevent the nano-particles from clumping or sticking together and also electrically insulates the nano-particles. Because the nano-particles are prevented from clumping, each nano-particle maintains its predefined diameter, thereby ensuring a consistent display of color across cosmetic surface 111. It should be noted that the sizing layer can be made from any of a number of materials depending on desired selective treatment responses.

According to one embodiment, the suspension matrix 117 is a polymer material. The polymer material may be pre-mixed (e.g., mixed before application) with pigment nano-particles 22. According to another embodiment, the suspension matrix 117 comprises individual sealing layers applied over individual particles of the pigment nano-particles 22, for example, such as polymer shells applied thereon. According to another embodiment, the suspension matrix 117 comprises a polymer material applied over the pigment nano-particles 22 after application of the pigment 22 to the surface 111, such as, for example, by using a spray-on or other technique. In other embodiments the suspension matrix may be applied prior to receiving pigment nano-particles 22, and may act to support pigment applied thereon.

As described above, the pigment nano-particles 22 may be suspended in the matrix 117. However, the suspension characteristics may be altered to induce further changes in appearance, structure, and functionality. For example, groups or agglomerations of nanoparticles may be formed. Turning to FIG. 4B, an example of selectively processing nano-particles is illustrated.

As shown, suspension matrix 117 includes agglomerations 119 of nano-particles. The agglomerations 119 may be induced through selective processing of surface region 118. Selective processing can be done as part of a manufacturing step or in some cases at the end user level. FIG. 4B illustrates a cross-sectional view of substrate 115 having a selectively processed layer 125. Closeup view 120 shows an enlarged view of a first portion 116 of selectively processed layer 125. Individual nano-particles 22 can include nano-particle 221 encased by associated sizing layer 222. The nano-particles 221 may be any suitable particles, for example, as described in the examples given above. The sizing layer 222 may be a silica-based sizing in some embodiments. Selective processing of the surface 111 may cause disruptions in sizing layers 222 in the vicinity of the processing, causing disruptions 225 in the sizings, and thereby allowing physical interaction (e.g., electromagnetic interaction and/or attraction) between individual nano-particles. Due to this physical interaction, the nano-particles may move closer together and further interact, thereby producing characteristics of larger particles. Therefore, even if one particular diameter nano-particle is used to produce pigment nano-particles 22, characteristics (e.g., color, conductivity, etc.) of larger nano-particles are possible through selective processing of the layer 125. Closeup view 121 shows a second portion 118 of processed layer 125. In portion 118 the selective processing causes a removal of sizing layers 222 from each of nano-particles 221. Once sizing layers 222 have been removed nano-particles 221 are free to interact and this can cause, as depicted, agglomeration into larger particles 119. In embodiments where nano-particles 221 are conductive this type of selective processing can cause a conductive path to be formed through layer 125. This type of pathway can be useful for many purposes including grounding of components through a substantially insulating layer. This type pathway can also be utilized to create electrical traces along an ink surface, or can even be employed to form an antenna. Removal of sizing layers 222 can be accomplished through the use of selective heating. For example, a laser can be utilized to sinter portion 118 of cosmetic surface 111, causing formations of agglomerations 119 to form in precise locations. In addition to forming a conductive path, this substantial change in particle size can effect a color change along cosmetic surface 111. This color change can serve many purposes. One useful aspect is to provide a clear indication of a location of conductive portions of surface 111. In some instances it can be used to create a graphic or design along surface 111.

Figure 5A:
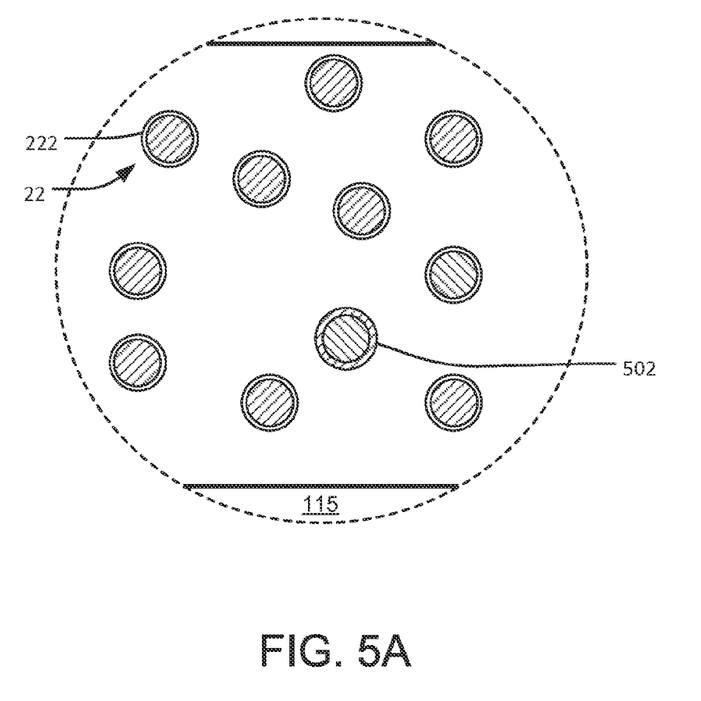
FIG. 5A is an enlarged view of a portion of the substrate of FIG. 4B.
Figure 5B:
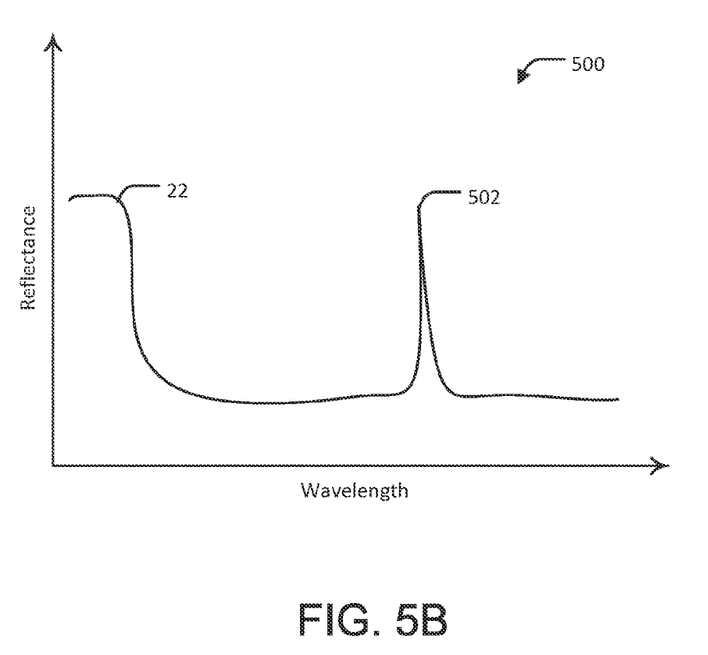
FIG. 5B shows a graph of reflectance of the substrate of FIG. 4B.

FIGS. 5A-5B show another configuration in which trace amounts of nano-particle pigments 502 are mixed in with nano-particle pigments 22. FIG. 5A shows another closeup view of layer 125 disposed on substrate 115. In the closeup view, a single nano-particle 502 is depicted. Nano-particle 502 can be for example a gold particle whereas nano-particles 22 are in one example silver particles. Furthermore, a sizing layer of particle 502 can be different than sizing layers 222. In an embodiment where a sizing layer of particle 502 has a lower melting temperature than sizing layer 222, a selective heating operation can be used to remove sizing layers only from nano-particles 502. In such an embodiment this can cause nano-particles 502 to take on different properties than nano-particles 22, even when the only difference between the nano-particles is a lack of a sizing layer. Regardless of the manner of mixing different nano-particles together, the end result is slight color variations in the surface. When those differences are trace amounts they may not be visible to the human eye. FIG. 5B shows a graph 500 in which a first peak corresponds to nano-particles 22 and a second peak corresponds to particles 502. While peak 502 is much slimmer and in many cases undetectable to a human eye, a colorimeter can be configured to detect the color variations caused by particles 502. This can, for example, allow a manufacturer to quickly determine if an item is an original or a counterfeit by analyzing a portion of the item that is generally treated with trace amounts of nano-particle 502.

In one embodiment a nano-particle infused ink can be utilized as a moisture sensor. If a sizing layer is configured to be disrupted by a particular chemical, said chemical may be used to disrupt the sizing. When that particular disrupting chemical is water applying the water sensitive ink in areas of a device that are known to be water ingress areas that nano-particle infused ink can provide a visual indication of whether that portion of the device has come into contact with a predetermined amount of water. The sizing layer can be removed or at least influenced to stick to adjacent particles in reaction to a certain volume of water, thereby causing a color shift along a surface of the infused ink. In some embodiments, removal of the sizing layer as a result of contact with the water can cause a conductive path to be formed that completes a circuit, thereby informing an associated device that the item has come into contact with water. In this way a user of the item can be notified of an undesired ingress of water, or any other chemical the nano-particle infused ink is configured to detect.

Due to an increased level of electrical conductivity produced by this particular formation when sizing is not included, the nano-particle infused ink can be utilized to create high sensitivity touch sensors. Furthermore, the nano-particles work well at conducting heat, so this nano-particle infused ink can be distributed along portions of an electrical device to help design preferred heat conduction pathways in the electrical device. In this way the particles could act as an embedded heat spreader. Other thermally related applications include designing a sizing layer of the nano-particles to evaporate off the nano-particles, thereby acting as a heat sensor that can vary its color or conductivity in accordance with a maximum temperature the nano-particles are exposed to.

In another embodiment, if the particles are infused within a radio frequency (RF) transparent matrix, they can be utilized to create an RF transparent metallic appearing surface. By applying the ink over antenna windows in electronic devices, discontinuities in a housing that would normally be quite obvious can be substantially masked. In this way substantially all of an exterior surface of an electronic device can take on an appearance of being metallic, while wireless communication pathways remain unhindered. Another advantage associated with the use of silver nano-particles is their utility in providing an anti-microbial coating to a device. The silver nano-particles can be applied to an outer surface of a device in a number of ways including spin coating, printing, and ion implantation. Finally, in another embodiment the pigment nano-particles can be used to coat a transparent structure such as glass, plastic or sapphire, to create a color filter. Opacity of the filter can be adjusted based on a particle density of the nano-particles.

Figure 5C:
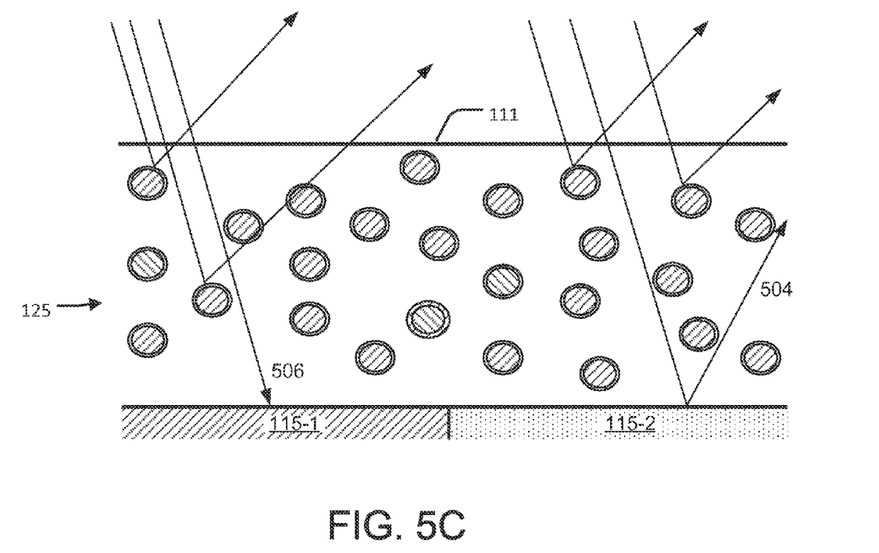
FIG. 5C shows a cross-sectional view of a portion of a multi-color substrate having a surface treatment disposed thereon.
Figure 5D:
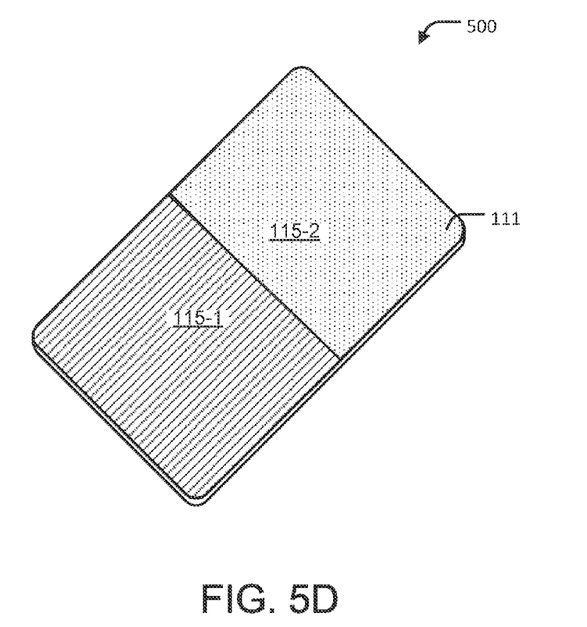
FIG. 5D shows a perspective view of a device having the multi-color substrate from FIG. 5C.

FIGS. 5C-5D show another embodiment where a change in color can be accomplished by changing a characteristic of an underlying substrate disposed below a layer of nano-particle infused dye or ink. In FIG. 5C layer 125 of nano-particle infused ink is disposed over substrate 115. Substrate 115 includes at least two distinct material regions, region 115-1 and region 115-2. In one embodiment such an underlying substrate can be created by a double shot injection molding process. When region 115-1 is a black substrate and region 115-2 is a white substrate, a transparent ink layer 125 can have radically different color profiles. For example, a die that can have a red color when disposed above region 115-2 can have a green color when disposed above region 115-1. This is due to light reflected off region 115-2 being combined with light beams reflected off the nano-particles. When light 506 hits region 115-1 it tends to be absorbed and so only light reflected off the nano-particles is returned. In this way a single formulation of ink can be used to produce a number of color variations simply by changing a property of the underlying substrate.

As described above, color-changes in and on cosmetic surfaces of substrates may be implemented through exemplary application of nano-particle pigments and associated suspensions of the same. Hereinafter, several methods of applying surface treatments are described in detail with reference to FIGS. 6-8.

Figure 6:
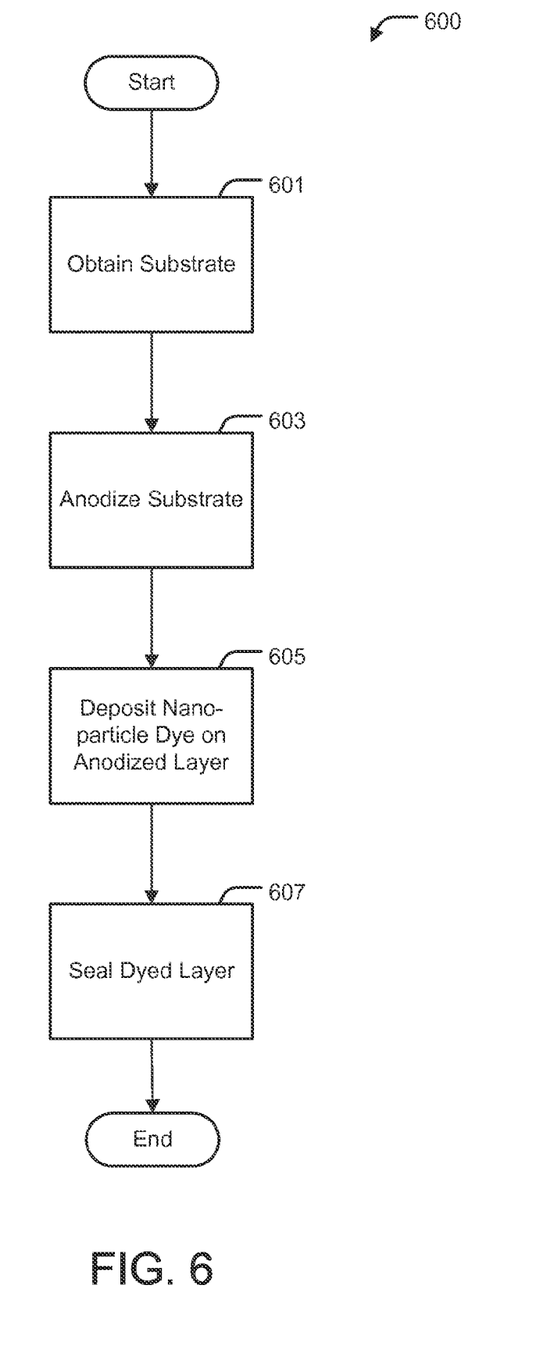
FIG. 6 shows flow chart describing a method of applying a surface treatment to a substrate, in accordance with an exemplary embodiment.

FIG. 6 shows flow chart describing a method 600 of applying a surface treatment to a substrate, in accordance with an exemplary embodiment.

With reference to FIG. 6, the method 600 begins by obtaining, receiving, and/or otherwise producing a substrate for processing at block 601. The substrate may be formed of any suitable material, including aluminum or stainless steel. Thereafter, the method 600 includes anodizing the substrate to form an anodized layer at block 603. The anodizing may include any anodizing technique, and may cause to form anodic pores, which may receive and support pigment. The method 600 further includes depositing a nano-particle based dye or pigment on the anodized layer at block 605. The nano-particle based dye or pigment may be substantially similar to pigment nano-particles 22 described herein. Thereafter, as an optional step, the method 600 may include sealing the dyed anodized layer at block 607. Any of the steps 601-607 may be altered, may be performed in differing orders, or may be omitted in some implementations.

Figure 7:
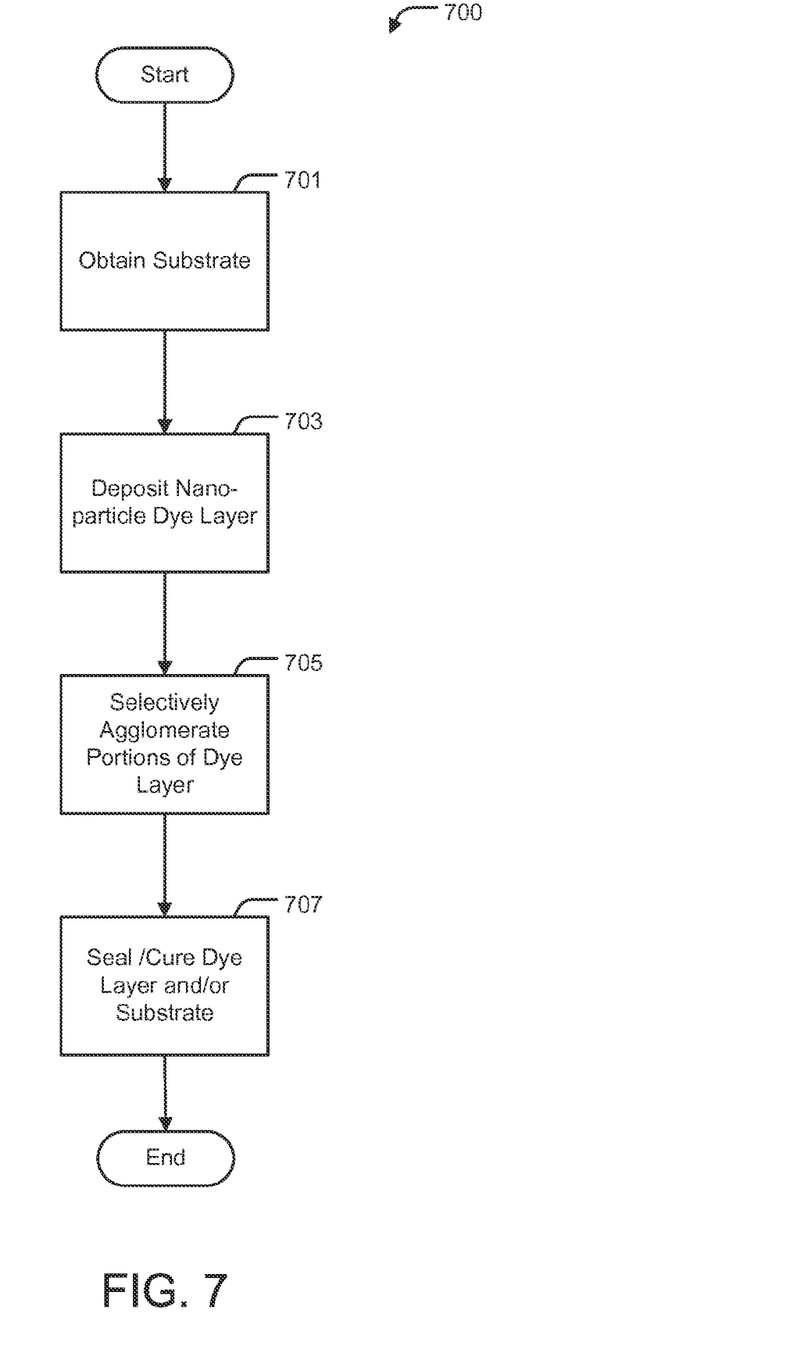
FIG. 7 shows flow chart describing an additional method of applying a surface treatment to a substrate, in accordance with an exemplary embodiment.

FIG. 7 shows flow chart describing an additional method 700 of applying a surface treatment to a substrate, in accordance with an exemplary embodiment.

With reference to FIG. 7, the method 700 begins by obtaining, receiving, and/or otherwise producing a substrate for processing at block 701. The substrate may be formed of any suitable material, including glass, plastic, aluminum, stainless steel, etc. Thereafter, the method 700 includes depositing a nano-particle based dye layer on at least a portion of a surface of the substrate at block 703. The nano-particle based dye layer may include pigments substantially similar to pigment nano-particles 22 described herein, and may further include a suspension matrix as described above. The suspension matrix may be pre-mixed with the pigment, may be applied before application of the pigment, or may be applied after application of the pigment. Thereafter, as an optional step, the method 700 may include selectively agglomerating portions of the dye layer at block 705. Subsequent to any selective processing or additional processing, the dye layer and/or substrate may be sealed or cured at block 707. Any of the steps 701-707 may be altered, may be performed in differing orders, or may be omitted in some implementations.

Figure 8:
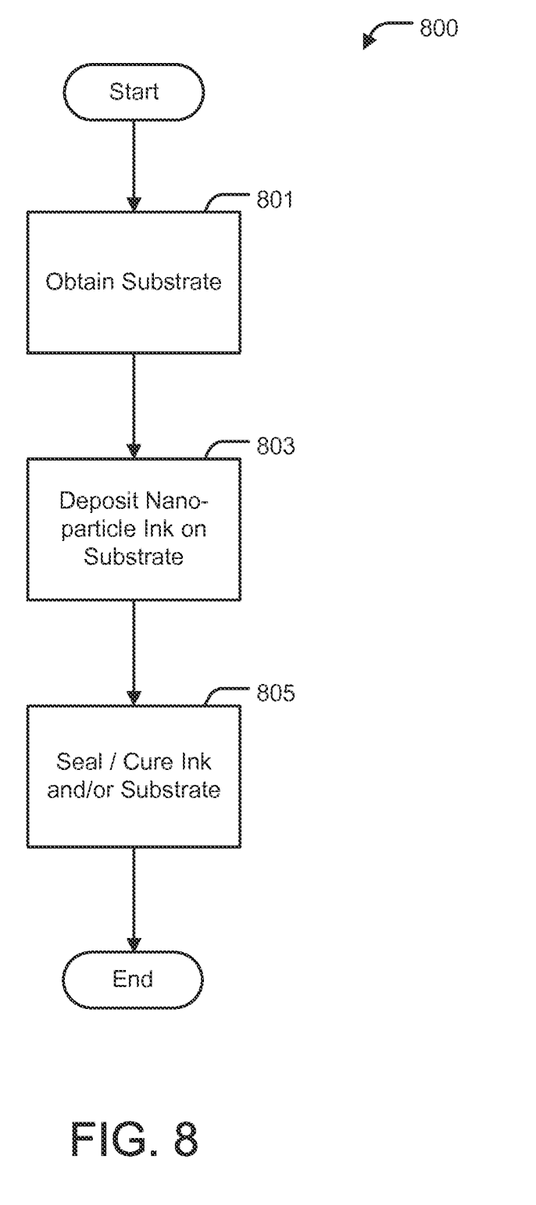
FIG. 8 shows flow chart describing yet another method of applying a surface treatment to a substrate, in accordance with an exemplary embodiment.

FIG. 8 shows flow chart describing yet another method 800 of applying a surface treatment to a substrate, in accordance with an exemplary embodiment.

With reference to FIG. 8, the method 800 begins by obtaining, receiving, and/or otherwise producing a substrate for processing at block 801. The substrate may be formed of any suitable material, including glass, plastic, aluminum, stainless steel, etc. Thereafter, the method 800 includes depositing nano-particle based ink on at least a portion of a surface of the substrate at block 803. The nano-particle based ink may include pigments substantially similar to pigment nano-particles 22 described herein, and may further include a suspension matrix as described above. The suspension matrix may be pre-mixed with the pigment, may be applied before application of the pigment, or may be applied after application of the pigment. Thereafter, as an optional step, the method 800 may include sealing or curing the ink and/or substrate at block 805. Any of the steps 801-805 may be altered, may be performed in differing orders, or may be omitted in some implementations.

The various aspects, embodiments, implementations or features of the described embodiments can be used separately or in any combination. Various aspects of the described methods can be implemented by software, hardware or a combination of hardware and software. The methods can also be embodied as computer readable code on a computer readable medium for controlling manufacturing operations or as computer readable code on a computer readable medium for controlling a manufacturing line for application of cosmetic inks on surfaces of products. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device having an anodic film, the anodic film comprising:
    silver nano-particles deposited within pores of the anodic film, the silver nano-particles having diameters sufficient for causing light incident the silver nano-particles within the anodic film to reflect wavelengths of light by plasmon resonance, at least some of the silver nano-particles characterized as having a triangular or hexagonal shape, wherein the diameters of the silver nano-particles and the shape are sufficient to cause a peak plasmon resonance around 550 nanometers associated with imparting a red color to the anodic film.

2. The electronic device of claim 1, wherein the at least some of the silver nano-particles are coated with a sizing layer.

3. The electronic device of claim 2, wherein the sizing layer is comprised of silica.

4. The electronic device of claim 1, wherein the first portion of the silver nano-particles is coated with a first type of sizing layer and a second portion of the silver nano-particles is coated with a second type of sizing layer different than the first type of sizing layer.

5. An electronic device having an anodic film, the anodic film comprising:
    silver nano-particles deposited within pores of the anodic film, the silver nano-particles having diameters sufficient for causing light incident the silver nano-particles within the anodic film to reflect wavelengths of light by plasmon resonance, at least some of the silver nano-particles characterized as having a triangular or hexagonal shape, wherein the diameters of the silver nano-particles and the shape are sufficient to cause a peak plasmon resonance around 750 nanometers associated with imparting a blue color to the anodic film.

6. An electronic device having an anodic film, the anodic film comprising:
   silver nano-particles deposited within pores of the anodic film, the silver nano-particles having diameters sufficient for causing light incident the silver nano-particles within the anodic film to reflect wavelengths of light by plasmon resonance, at least some of the silver nano-particles characterized as having a triangular or hexagonal shape, wherein the diameters of the silver nano-particles and the shape are sufficient to cause a peak plasmon resonance around 950 nanometers associated with imparting a green color to the anodic film.

* * * * *

UNITED STATES PATENT AND TRADEMARK OFFICE
CERTIFICATE OF CORRECTION

PATENT NO.       : 9,493,876 B2
APPLICATION NO.  : 14/023410
DATED            : November 15, 2016
INVENTOR(S)      : Lucy E. Browning et al.

It is certified that error appears in the above-identified patent and that said Letters Patent is hereby corrected as shown below:

On the Title Page

Item (57) please replace the ABSTRACT with the following:
"The described embodiments relate generally to cosmetic surfaces and associated treatments to alter a color of cosmetic surfaces. According to one embodiment, cosmetic ink configured to be applied to a cosmetic surface can include a suspension matrix configured to suspend a number of small particles in the suspension matrix. Each of the small particles of the suspension matrix is within a desired overall diameter to cause a user to perceive a desired color due to plasmon resonance of the small particles."

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*